United States Patent
Chiba et al.

(10) Patent No.: US 8,357,615 B2
(45) Date of Patent: *Jan. 22, 2013

(54) METHOD OF MANUFACTURING SEMICONDUCTOR DEVICE

(75) Inventors: Yuki Chiba, Albany, NY (US); Eiichi Nishimura, Nirasaki (JP); Ryuichi Asako, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1210 days.

This patent is subject to a terminal disclaimer.

(21) Appl. No.: 12/216,154

(22) Filed: Jun. 30, 2008

(65) Prior Publication Data

US 2009/0011605 A1 Jan. 8, 2009

Related U.S. Application Data

(60) Provisional application No. 60/960,164, filed on Sep. 18, 2007.

(30) Foreign Application Priority Data

Jul. 2, 2007 (JP) ................................ 2007-174330

(51) Int. Cl.
*H01L 21/302* (2006.01)
*B44C 1/22* (2006.01)
(52) U.S. Cl. ........ 438/706; 438/715; 438/725; 438/905; 438/906; 216/58; 216/67
(58) Field of Classification Search .................. 438/706, 438/715, 725, 905, 906; 216/58, 67
See application file for complete search history.

(56) References Cited

U.S. PATENT DOCUMENTS

| 5,221,366 | A  | * | 6/1993  | Roberts et al. ................. 148/22 |
| 5,650,015 | A  | * | 7/1997  | Kobayashi ........................ 134/2 |
| 6,534,413 | B1 | * | 3/2003  | Robertson et al. ............ 438/706 |
| 8,048,687 | B2 | * | 11/2011 | Shimizu et al. .................... 438/4 |
| 2009/0014414 | A1 | * | 1/2009 | Tomioka et al. ................ 216/41 |
| 2009/0179003 | A1 | * | 7/2009 | Nishimura ....................... 216/41 |
| 2009/0301996 | A1 | * | 12/2009 | Visintin et al. ................. 216/13 |

FOREIGN PATENT DOCUMENTS

JP 2006-49798 2/2006

* cited by examiner

*Primary Examiner* — Shamim Ahmed
(74) *Attorney, Agent, or Firm* — Smith, Gambrell & Russell, LLP

(57) ABSTRACT

The present invention is an apparatus for manufacturing a semiconductor device comprising: a process vessel including a stage on which a substrate is placed, the substrate having a low dielectric constant film with a resist pattern being formed in an upper layer of the low dielectric constant film; an etching-gas supply unit that supplies an etching gas into the process vessel so as to etch the low dielectric constant film; an ashing-gas unit means that supplies an ashing gas into the process vessel so as to ash the resist pattern formed in the upper layer of the low dielectric constant film after the low dielectric constant film has been subjected to an etching process; a plasma generating means that generates a plasma by supplying an energy to the etching gas and the ashing gas in the process vessel; a unit that supplies a dipivaloylmethane gas into the process vessel, after the low dielectric constant film has been subjected to an ashing process, in order to recover a damage layer of the low dielectric constant film which has been damaged by the plasma; and a heating unit that enables the dipivaloylmethane gas to come into contact with a surface of the substrate under a heated condition.

15 Claims, 7 Drawing Sheets

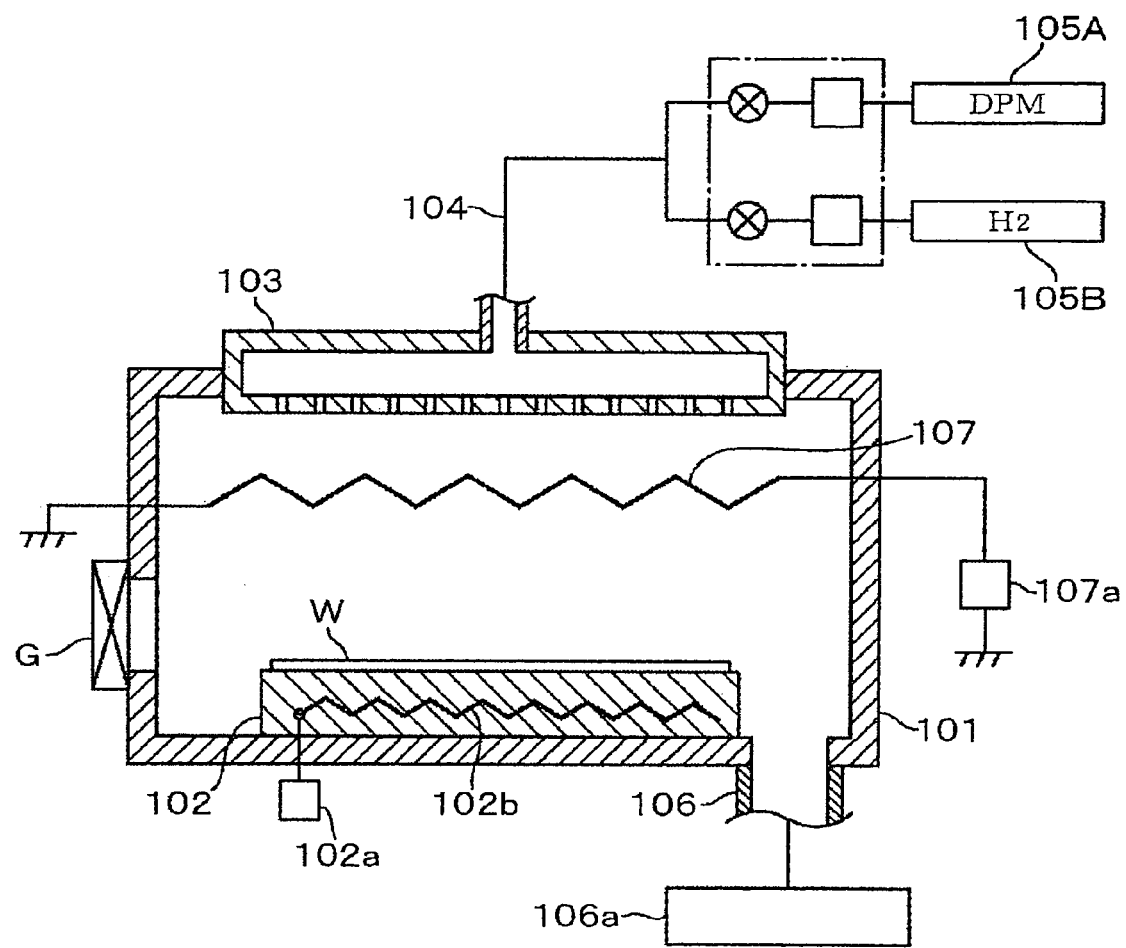
F I G . 7

METHOD OF MANUFACTURING SEMICONDUCTOR DEVICE

CROSS REFERENCE TO RELATED APPLICATIONS

This application claims priority from U.S. Provisional Application No. 60/960,164 filed on Sep. 18, 2007, and Japanese Patent Application No. 2007-174330 filed on Jul. 2, 2007. The entire contents of these applications are incorporated herein by reference.

FIELD OF THE INVENTION

The present invention relates to a technique used in a manufacturing step of a semiconductor device, wherein, after an organic low dielectric constant film that is an interlayer dielectric film is etched, a resist thereof is ashed, and then a damage of the low dielectric constant film is recovered.

In a dual damascene step as a method of forming a multilayer wiring structure in a semiconductor device, there are formed, in an interlayer dielectric film, a via hole through which a wiring of an upper layer and a wiring of a lower layer are connected, and a trench (groove) in which a wiring of the upper layer is embedded. Copper as a wiring metal is embedded in these recesses.

In order to form the recesses such as via holes and trenches in the interlayer dielectric film, an etching step is performed by a plasma obtained from a process gas. Thereafter, a resist is ashed by a plasma obtained from an oxygen gas or a carbonic dioxide gas.

With a view to accelerating a signal transmission, formation of an interlayer dielectric film out of a material having a low relative dielectric constant has been studied. An SiCOH film is known as a representative low dielectric constant film.

However, in the above etching step and the above ashing step, the SiCOH film may be damaged by the plasma. In particular, in the ashing step, an oxygen gas and a carbon dioxide gas are made into plasma, so that active species containing oxygen are generated. Meanwhile, the SICOH film may be seriously damaged because the SiCOH film is an organic film. To be specific, electric properties of the SICOH film may be considerably deteriorated.

To be "damaged" herein means that Si—$CH_3$ groups in the SiCOH film is oxidized to become, e.g., Si—OH groups, in the etching step and the ashing step. Such a damage may invite various problems such as a broadening of a line width of a pattern after a wafer is washed, an increase in relative dielectric constant, an increase in leak current, and a deterioration in reliability caused by the moisture absorption.

It has been known that a silazane-containing gas is supplied to the SiCOH film after the ashing process, so as to recover the damage (see, JP2006-49798A (particularly, sections 0034 and 0035)).

As an apparatus for forming a recess, in which a copper wiring is embedded, after a mask pattern has been formed on a low dielectric constant film, there is generally employed a multi-chamber system in which a plurality of chambers are connected to a vacuum transfer chamber. The etching step and the ashing step are often performed by a common processing apparatus such as a parallel-plate type plasma apparatus.

However, recently, the ashing step is sometimes performed by an ICP plasma apparatus using an induction coil. In this case, the etching step and the ashing step are performed in separate chambers (separate processing apparatuses).

A reaction product generated during the etching process and the ashing process adheres to the chamber of the plasma apparatus in which the etching process and the ashing process are performed. Thus, there is a possibility that, a silicon in a silazane-containing gas reacts with the reaction product to generate a by-product, or the silicon reacts with moisture to generate a by-product, and that the by-product invites a particle contamination. Thus, the recovering process using a silzane-containing gas has to be performed in a chamber separate from the chamber in which the etching process and the ashing process are performed.

Thus, when the recovering process is performed in a multi-chamber system, for example, a chamber exclusively used for the recovering process has to be connected to a vacuum transfer chamber, separately from the chamber in which the etching process and the ashing process are performed. This results in an increase in cost. In addition, the number of chambers for the other processes including the etching process and the ashing process, which are connected to the vacuum transfer chamber, is limited because of the connection of the chamber exclusively used for the recovering process. This interferes with an improvement in a throughput of the overall multi-chamber system.

SUMMARY OF THE INVENTION

The present invention has been made in view of the above circumstances. The object of the present invention is to provide an apparatus for manufacturing a semiconductor device and a method for manufacturing a semiconductor device, wherein a process vessel for a recovering process can be also used for an ashing process.

The present invention is an apparatus for manufacturing a semiconductor device comprising: a process vessel including a stage on which a substrate is placed, the substrate having a low dielectric constant film with a resist pattern being formed in an upper layer of the low dielectric constant film; an etching-gas supply unit that supplies an etching gas into the process vessel so as to etch the low dielectric constant film; an ashing-gas unit means that supplies an ashing gas into the process vessel so as to ash the resist pattern formed in the upper layer of the low dielectric constant film after the low dielectric constant film has been subjected to an etching process; a plasma generating means that generates a plasma by supplying an energy to the etching gas and the ashing gas in the process vessel; a unit that supplies a dipivaloylmethane gas into the process vessel, after the low dielectric constant film has been subjected to an ashing process, in order to recover a damage layer of the low dielectric constant film which has been damaged by the plasma; and a heating unit that enables the dipivaloylmethane gas to come into contact with a surface of the substrate under a heated condition.

According to the present invention, the recovering process for the low dielectric constant film, which has damaged by the etching process and the ashing process, is performed by using the dipivaloylmethane (hereinafter referred to as "DPM") gas. Since the DPM gas consists of molecules of only C, H, and O, even when the DPM gas comes into contact with a reaction product generated by the etching process and the ashing process or comes into contact with moisture, no special by-product is generated. Thus, the process vessel for performing the etching step and the ashing process can be also used as a process vessel for performing the recovering process for the low dielectric constant film. Therefore, an increase in cost for the apparatus can be avoided.

Alternatively, the present invention is an apparatus for manufacturing a semiconductor device comprising: a first process vessel and a second process vessel, each of which includes a stage on which a substrate is placed, the substrate having a low dielectric constant film with a resist pattern formed in an upper layer of the low dielectric constant film; an etching-gas supply unit that supplies an etching gas into the first process vessel so as to etch the low dielectric constant film; a first plasma generating unit that generates a plasma by supplying an energy to the etching gas in the first process vessel; an ashing-gas supply means that supplies an ashing gas into the second process vessel so as to ash the resist pattern in the upper layer of the low dielectric constant film after the low dielectric constant film has been subjected to an etching process in the first process vessel; a unit that activates the ashing gas by supplying an energy to the ashing gas in the second process vessel; a unit that supplies a dipivaloylmethane gas into the second process vessel, after the low dielectric constant film has been subjected to an ashing process in the second vessel, in order to recover a damage layer of the low dielectric constant film which has been damaged by the ashing process; and a heating unit that enables the dipivaloylmethane gas to come into contact with a surface of the substrate under a heated condition.

According to the present invention, the recovering process for the low dielectric constant film, which has damaged by the etching process and the ashing process, is performed by using the dipivaloylmethane (hereinafter referred to as "DPM") gas. Since the DPM gas consists of molecules of only C, H, and O, even when the DPM gas comes into contact with a reaction product generated by the etching process and the ashing process or comes into contact with moisture, no special by-product is generated. Thus, the process vessel for performing the the ashing process can be also used as a process vessel for performing the recovering process for the low dielectric constant film. Therefore, an increase in cost for the apparatus can be avoided.

At this time, for example, the ashing gas is a gas that generates a hydrogen radical.

In addition, preferably, a temperature of the substrate is 150° C. to 400° C. when the substrate is ashed.

In addition, for example, the stage is provided with a cooling unit in order to cool the substrate after the substrate has been ashed.

In addition, for example, the heating unit is a heater disposed in the stage.

Alternatively, for example, the heating unit is disposed in the gas supply unit in order to heat the dipivaloylmethane gas.

In addition, the present invention is a method for manufacturing a semiconductor device by using a substrate having a low dielectric constant film with a resist pattern being formed in an upper layer of the low dielectric constant film, the method comprising: a placing step in which the substrate is placed on a stage in a process vessel; an etching step following to the placing step, in which an etching gas is supplied into the process vessel, and the gas is made into plasma so as to etch the low dielectric constant film by the plasma; an ashing step following to the etching step, in which an ashing gas is supplied into the process vessel, and the gas is activated to generate active species so as to ash the resist pattern by the plasma; and a step following to the ashing step, in which, in order to recover a damage layer of the low dielectric constant film which has been damaged by the plasma, a dipivaloylmethane gas is supplied into the process vessel so that the gas and the damage layer are brought into contact with each other under a heated condition.

Alternatively, the present invention is a method for manufacturing a semiconductor device by using a substrate having a low dielectric constant film with a resist pattern being formed in an upper layer of the low dielectric constant film, the method comprising: a placing step in which the substrate is placed on a stage in a first process vessel; an etching step following to the placing step, in which an etching gas is supplied into the first process vessel, and the gas is made into plasma so as to etch the low dielectric constant film by the plasma; a transferring step following to the etching step, in which the substrate is transferred from the first process vessel to a second process vessel; an ashing step following to the transferring step, in which an ashing gas is supplied into the second process vessel, and the gas is activated so as to ash the resist pattern by active species; and a step following to the ashing step, in which, in order to recover a damage layer of the low dielectric constant film which has been damaged by the ashing process, a dipivaloylmethane gas is supplied into the second process vessel so that the gas and the damage layer are brought into contact with each other under a heated condition.

It is preferable that the step, in which the dipivaloylmethane gas and the damage layer are brought into contact with each other under a heated condition, includes a step of heating the substrate by a heater disposed in the stage. Alternatively, it is preferable that the step, in which the dipivaloylmethane gas and the damage layer are brought into contact with each other under a heated condition, includes a step of heating the dipivaloylmethane gas and then supplying the dipivaloylmethane gas into the process vessel.

In addition, the present invention is a storage medium storing a computer program operatable on a computer, wherein the computer program includes steps for performing a method for manufacturing a semiconductor device having the aforementioned features.

BRIEF DESCRIPTION OF THE DRAWINGS

FIG. 7 is a longitudinal sectional view showing another example of the ashing apparatus used for performing the recovering step in one embodiment of the method for manufacturing a semiconductor device according to the present invention.

BEST MODE FOR CARRYING OUT THE INVENTION

First Embodiment

There will be described an embodiment in which the apparatus for manufacturing a semiconductor device is applied to a parallel-plate type plasma processing apparatus.

Figure 1:
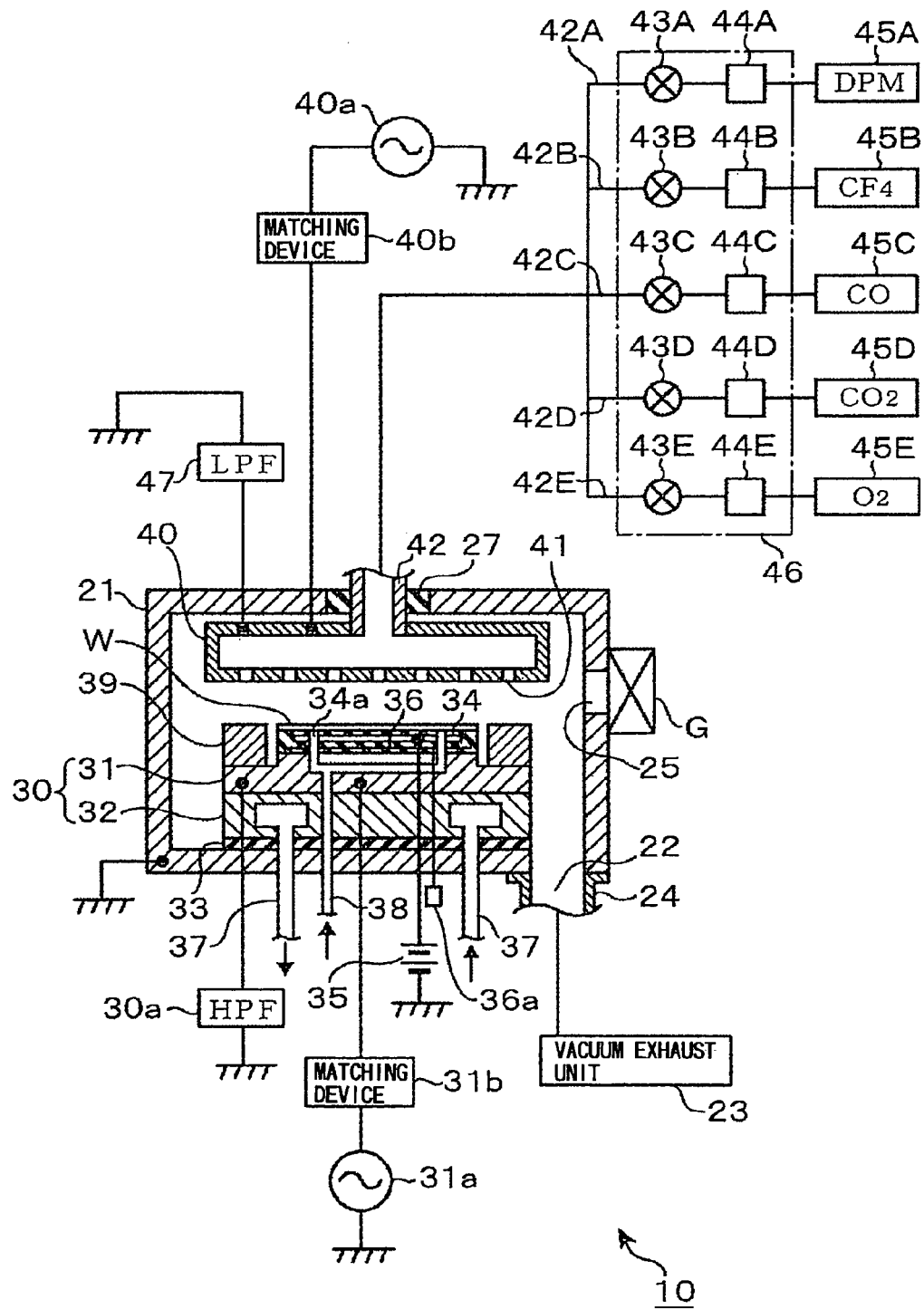
FIG. 1 is a longitudinal sectional view showing an example of a plasma processing apparatus used for performing an etching step and an ashing step in one embodiment of a method for manufacturing a semiconductor device according to the present invention.

As shown in FIG. 1, this plasma processing apparatus includes: a process vessel 21 formed of a vacuum chamber; a stage 30 located on a center of a bottom surface of the process vessel 21; and an upper electrode 40 disposed on an upper part of the process vessel 21.

A vacuum exhaust means 23 including a vacuum pump and the like is connected to an outlet port 22 formed in the bottom surface of the process vessel 21 through an exhaust pipe 24. A transfer port 25 for a wafer W is formed in a wall surface of the process vessel 21. The transfer port 25 is capable of being opened and closed by a gate valve G. The process vessel 21 is grounded.

The stage 30 is composed of a lower electrode 31 and a support body 32 that supports the lower electrode 31 from below. The stage 30 is located on the bottom surface of the process vessel 21 via an insulation member 33. Disposed on an upper part of the stage 30 is an electrostatic chuck 34 to which an electric voltage is applied from a high-voltage DC power source 35. Thus, a wafer W is electrostatically absorbed on the stage 30. In addition, disposed in the stage 30 is a heater 36 as a heating unit connected to the power source 35, so that a wafer W placed on the stage 30 can be heated to −20° C. to 150° C.

A temperature-adjusting flow path 37, through which a predetermined temperature-adjusting medium flows, is formed in the stage 30. Due to the temperature-adjusting medium, a temperature of the wafer W can be adjusted to a desired temperature when the wafer W is etched and ashed, for example. In addition, after a recovering process for a low dielectric constant film, the temperature-adjusting medium functions as a means for cooling the stage 30 to a set temperature for a succeeding etching process for another wafer W.

Further, a gas flow path 38 through which a heat-conductive gas such as an He (helium) gas is supplied as a backside gas, is formed in the stage 30. The gas flow path 38 is opened at a plurality of positions in the upper surface of the stage 30. These openings are communicated with through-holes 34a formed in the electrostatic chuck 34.

The lower electrode 31 is grounded via a high-pass filter (HPF) 30a. A radiofrequency power source 31a supplying a frequency of 2 MHz is connected to the lower electrode 31 via a matching device 31b. A focus ring 39 is arranged along an outer periphery of the lower electrode 31 so as to surround the electrostatic chuck 34. When a plasma is generated, the plasma is adapted to focus on a wafer W placed on the stage 30 through the focus ring 39.

The upper electrode 40 is formed to have a hollow shape. In a lower surface of the upper electrode 40, there are formed, e.g., uniformly, a number of holes 41 for supplying a process gas into the process vessel 21 in a dispersed manner. Thus, a gas showerhead is structured. A gas introducing pipe 42 as a gas supply path is connected to a center of the upper surface of the upper electrode 40. The gas introducing pipe 42 passes through the center of the upper surface of the process vessel 21 via an insulation member 27. The gas introducing pipe 42 is diverged into five branch pipes 42A to 42E on an upstream side thereof. The branch pipes 42A to 42E are connected to gas supply sources 45A to 45E via valves 43A to 43E and flow-rate control parts 44A to 44E, respectively. The gas supply sources 45A to 45E are, for example, a DPM (dipivaloylmethane $(CH_3)_3CCOCH_2COC(CH_3)_3$) gas source, a $CF_4$ gas source, a CO gas source, a $CO_2$ gas source, and an $O_2$ gas source, respectively. A DPM gas is a gas for the recovering process, a $CF_4$ gas is a gas for the etching process, and an $O_2$ gas is a gas for the ashing process. The branch pipes 42A, 42B, and 42E are a unit for supplying the dipivaloylmethane gas, a unit for supplying the etching gas, and a unit for supplying the ashing gas. DPM is liquid at a normal temperature, and thus the DPM gas source 45A is equipped with a heating mechanism (carburetor), not shown, for vaporizing DPM. The valves 43A to 43E and the flow-rate control parts 44A to 44E constitute a gas supply system 46.

The upper electrode 40 is grounded via a low-pass filter (LPF) 47. A radiofrequency power source 40a, which supplies a frequency, for example 60 MHz, higher than that of the radiofrequency power source 31a, is connected to the upper electrode 40 via a matching device 40b.

A radiofrequency supplied from the radiofrequency power source 40a connected to the upper electrode 40 is a radiofrequency for making a process gas into plasma. A radiofrequency supplied from the radiofrequency power source 31a connected to the lower electrode 31 is a radiofrequency for applying a bias power to a wafer W so as to draw ions in the plasma to a surface of the wafer W.

Figure 2:
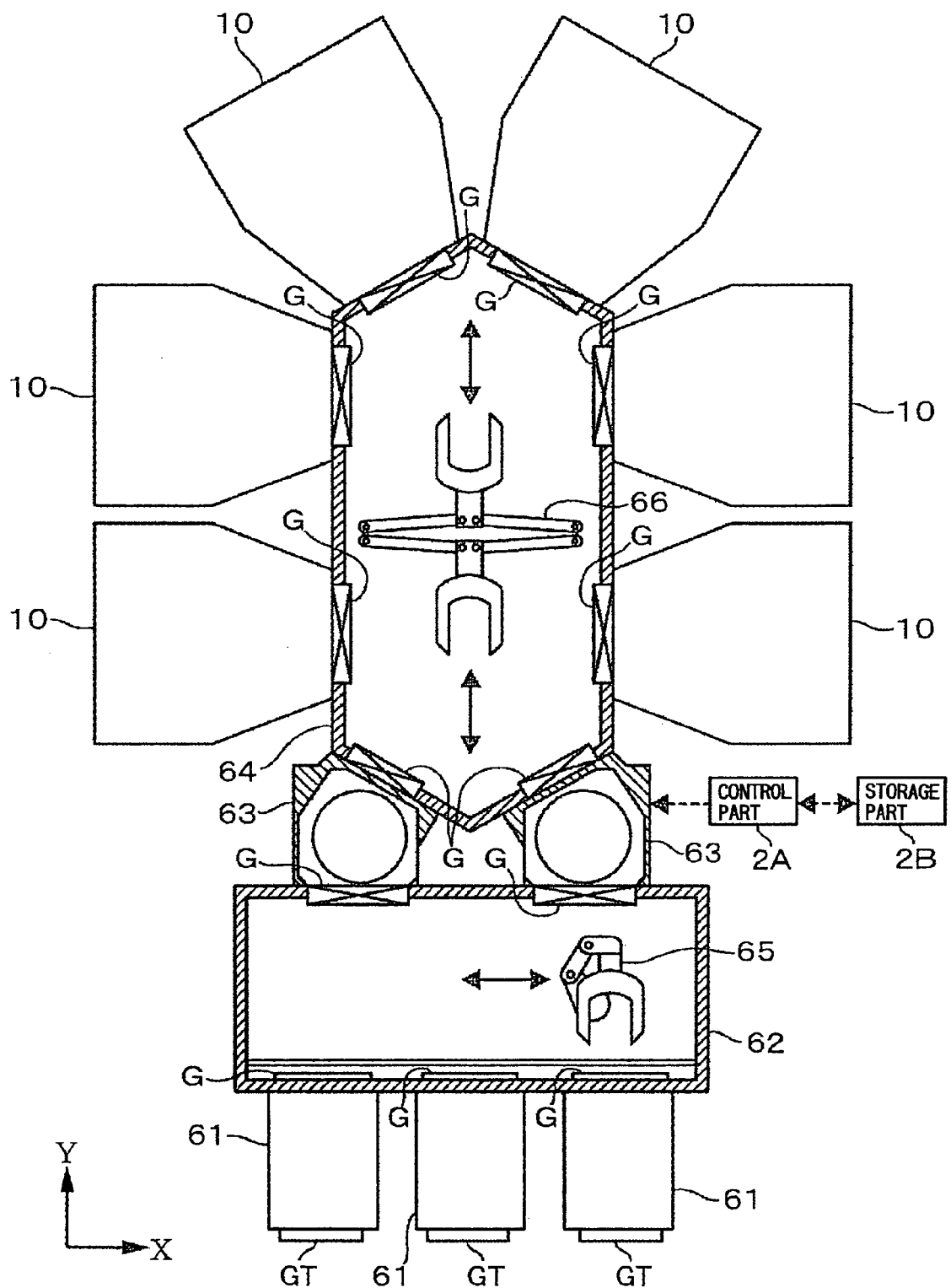
FIG. 2 is a plan view of showing an example of a substrate processing apparatus to which the plasma processing apparatus shown in FIG. 1 is connected.

As shown in FIG. 2, the aforementioned plasma processing apparatus (indicated by the reference number "10") is structured as a part of a substrate processing apparatus which is a multi-chamber system.

The substrate processing apparatus is simply described below. The substrate processing apparatus includes a carrier chamber 61, a first transfer chamber 62 of an atmospheric air, a load lock chamber 63, and a second transfer chamber 64 of a vacuum atmosphere.

The plurality of, e.g., six in this example, plasma processing apparatuses 10 shown in FIG. 1 are hermetically connected to the second transfer chamber 64. Thus, a plurality of wafers W. i.e., six wafers W in this case, can be simultaneously processed. An inside of the second transfer chamber 64 is configured to provide a vacuum atmosphere.

The first transfer chamber 62 is provided with a transfer arm 65 as a first transfer means for transporting a wafer W between the carrier chamber 61 and the load lock chamber 63. The second transfer chamber 64 is provided with a transfer arm 66 as a second transfer means for transporting a wafer W between the load lock chamber 63, the plasma processing chamber 10, and the recovery processing apparatus 50.

The substrate processing apparatus is equipped with a control part 2A formed of a computer, for example. The control part 2A has a data processing part formed of a program, a memory, and a CPU. The program incorporates commands for causing the control part 2A to send control signals to respective parts of the substrate processing apparatus so as to perform steps described below. The memory has a domain in which values of various process parameters such as a process pressure, a process temperature, a process period, a gas flow-rate, a power, and so on can be written. When the CPU executes the commands of the program, the values of these process parameters are read out, and control signals corresponding to the parameter values are sent to the respective parts of the substrate processing apparatus. The program (which may be accompanied with a program relating to an input operation of the process parameters and/or a display thereof) is generally stored in a storage part 2B formed of, e.g., a flexible disc, a compact disc, a hard disc, or an MO (magnet optic disc), and is installed in the control part 2A.

Next, an operation of the substrate processing apparatus is described, with a focus on a process performed by the plasma processing apparatus. Described herein is a case in which an $(n+1)^{th}$ circuit layer is formed as an upper layer on an $n^{th}$ circuit layer which has been formed on a wafer W as a substrate.

Figure 3A:
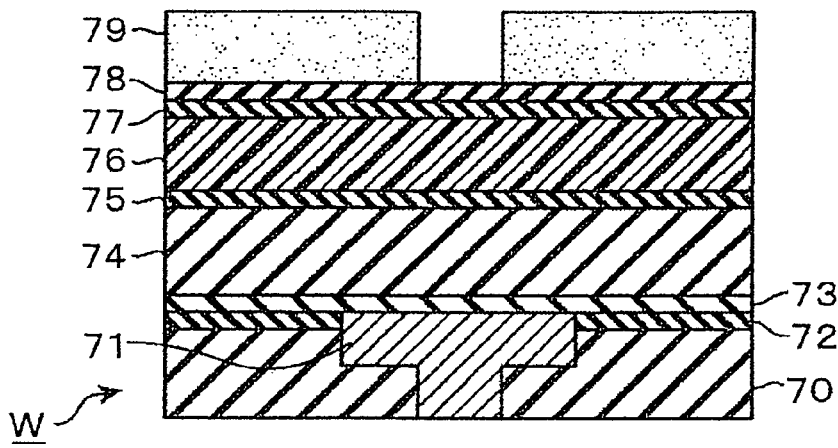
FIGS. 3A to 3C are cross-sectional views of a substrate, for explaining steps in one embodiment of the method for manufacturing a semiconductor device according to the present invention.

Firstly, an example of a semiconductor substrate (hereinafter referred to as "wafer" W), to which the method of manufacturing a semiconductor device according to the present invention is performed, is described with reference to FIG. 3A. An $n^{th}$ circuit layer has a structure in which a wiring 71 formed of a metal such as Cu is embedded in an SiCOH film 70 which is an interlayer dielectric film. On an upper part of the $n^{th}$ circuit layer, a cap film 72 and a barrier film 73 are stacked in this order from below. The cap film 72 is a film for protecting the circuit layer from a mechanical impact during a CMP process, for example. The barrier film 73 is a film for restraining diffusion of Cu between the upper and lower circuit layers. Although a barrier film for restraining diffusion of the metal is also formed between the SiCOH film 70 and the wiring 71, illustration and description thereof are omitted.

Stacked on an upper part of the barrier film 73 are an SiCOH film 74, a cap film 75, a bottom resist film 76, an oxidation film 77, an anti-reflection film 78, and a photoresist mask 79 as a resist pattern, in this order from below. The photoresist mask 79 is patterned so as to form a via hole in the SiCOH film 74.

Next, processes to be performed to the above wafer W are described. In the substrate processing apparatus, a carrier, which is a transfer vessel of a wafer W, is firstly loaded into the carrier chamber 61 from the atmospheric side via a gate door GT. Then, the wafer W is loaded into the load lock chamber 63 by the transfer arm 65 through the first transfer chamber 62. Then, the wafer W is transferred by the transfer arm 66 into the process vessel 21 of the plasma processing apparatus 10 through the second transfer chamber 64, and is placed on the stage 30. After that, the gate valve G is closed, and a backside gas is supplied from the gas flow path 38.

Then, an inside of the process vessel 21 is held at a predetermined vacuum degree by the exhaust system. Thereafter, a process gas such as a $CF_4$ gas is supplied from the gas supply system 46 at a predetermined flow rate. Subsequently, a radiofrequency of 60 MHz is supplied to the upper electrode 40 with a predetermined power. Thus, the process gas is made plasma. In addition, as a radiofrequency for biasing, a radiofrequency of 2 MHz is supplied to the lower electrode 31 with a predetermined power. By this plasma process, the anti-reflection film 78 and the oxidation film 77 are etched.

Then, the supply of the radiofrequencies and the process gas is stopped, and the process vessel 21 is evacuated. Then, a $CO_2$ gas and a CO gas as process gases are supplied into the process vessel 21 at predetermined flow rates, and radiofrequencies with predetermined powers are supplied to the upper electrode 40 and the lower electrode 31. Thus, the process gases are similarly made plasma, and the bottom resist film 76 is etched.

Figure 3B:
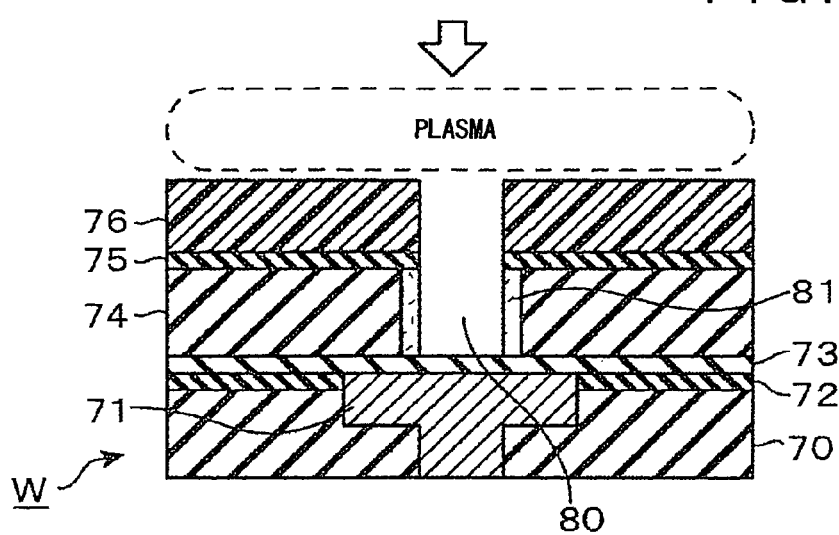

Thereafter, the supply of the radiofrequencies and the process gases is stopped, and the process vessel 21 is evacuated. Then, a $CF_4$ gas as a process gas is supplied into the process vessel 21 at a predetermined flow rate, and a pressure in the process vessel 21 is set at a predetermined vacuum degree. Then, predetermined powers are supplied to the upper electrode 40 and the lower electrode 31, whereby the process gas is made plasma. When the plasma is supplied to the wafer W, the cap film 75 and the SiCOH film 74 are etched. As shown in FIG. 3B, due to the etching process, a hole 80 is formed in the SiCOH film 74 so that a surface of the barrier film 73 is exposed.

At this time, the SiCOH film 74 is slightly damaged by an energy of the plasma. Thus, a damage layer 81 is formed on a sidewall of the hole 80. As described above, the damage layer 81 is a layer resulting from the desorption of the organic substance that has been connected to the silicon (Si) in the SiCOH film 74.

In the above etching step, by adjusting a temperature of the temperature-adjusting medium flowing through the temperature-adjusting flow path 37, the wafer W is maintained at a temperature between about 0° C. and about 60° C., depending on a balance between a heat input to the wafer W from the plasma and a heat release therefrom to the temperature-adjusting medium.

Figure 3C:
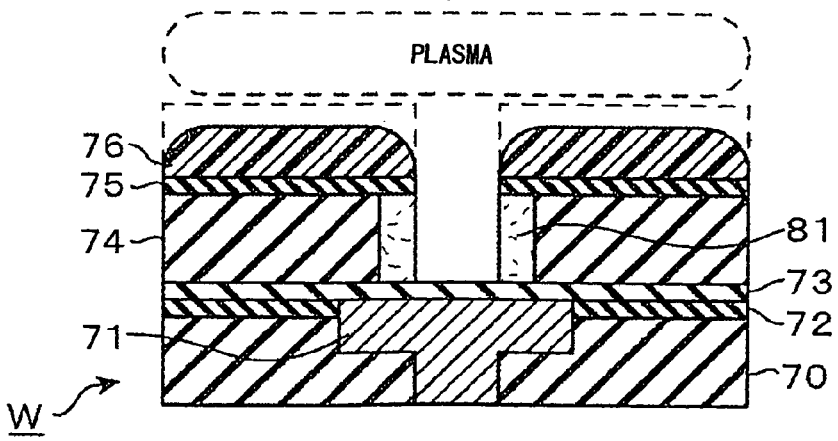

Thereafter, the supply of the radiofrequencies and the process gas is stopped, and the process vessel 21 is evacuated. Then, an oxygen gas as a process gas is supplied into the process vessel 21 at a predetermined flow rate, and the inside of the process vessel 21 is adjusted at a predetermined vacuum degree. Then, predetermined powers are supplied to the upper electrode 40 and the lower electrode 31, so that the oxygen gas is made plasma. By the radiofrequency for biasing, which is supplied from the lower electrode 31, the plasma is drawn to the wafer W, whereby the bottom resist film 76 is ashed and removed, as shown in FIG. 3C. Also in this ashing step, the wafer W is maintained at a temperature between about 0° C. and about 60° C., for example.

When the sidewall of the SiCOH film 74 (side surface of the hole 80) is exposed to the plasma, an organic substance such as a methyl group is desorbed from the inside of the film. Due to the desorption of the methyl groups, a dangling bond that is highly active (reactive) is generated in Si in the SiCOH film 74. Moisture slightly contained in the process gas and/or moisture generated by a reaction between the oxygen gas and hydrogen in the SiCOH film 74 is bonded with the dangling bond, so that an Si—OH bond is formed.

The oxygen plasma invades the inside of the SiCOH film 74 through voids formed by the desorption of the methyl groups, so that methyl groups inside the SiCOH film 74 are sequentially desorbed from the SiCOH film 74. As a result, the aforementioned damage layer 81 becomes thicker (deeper). At this time, since the damage layer 81 is porous because of the desorption of the methyl groups, a surface of the damage layer 81 is flattened and made denser by an energy of oxygen ions in the plasma.

After the etching process and the ashing process have been performed in the above manner, a by-product generated by a reaction between the plasma and/or the SiCOH film 74 and by a reaction between the plasma and the resist adheres as a deposit to some part of an inner wall of the process vessel 21 to which the plasma has come into contact.

Thereafter, the supply of the radiofrequencies and the process gas is stopped, and the process vessel 21 is evacuated. Then, a heating value of the heater 36 is increased, and the wafer W is heated to a set temperature of, e.g., between 50° C. to 150° C. In addition, a main valve, not shown, of the exhaust pipe 24 is closed, and a DPM gas is supplied into the process vessel 21 until a pressure in the process vessel 21 reaches 267 Pa (2 Torr), for example. After that, the supply of the DPM gas is stopped, and the process vessel 21 is closed (to provide a closed space). This state is held for 150 seconds, for example.

Figure 4A:
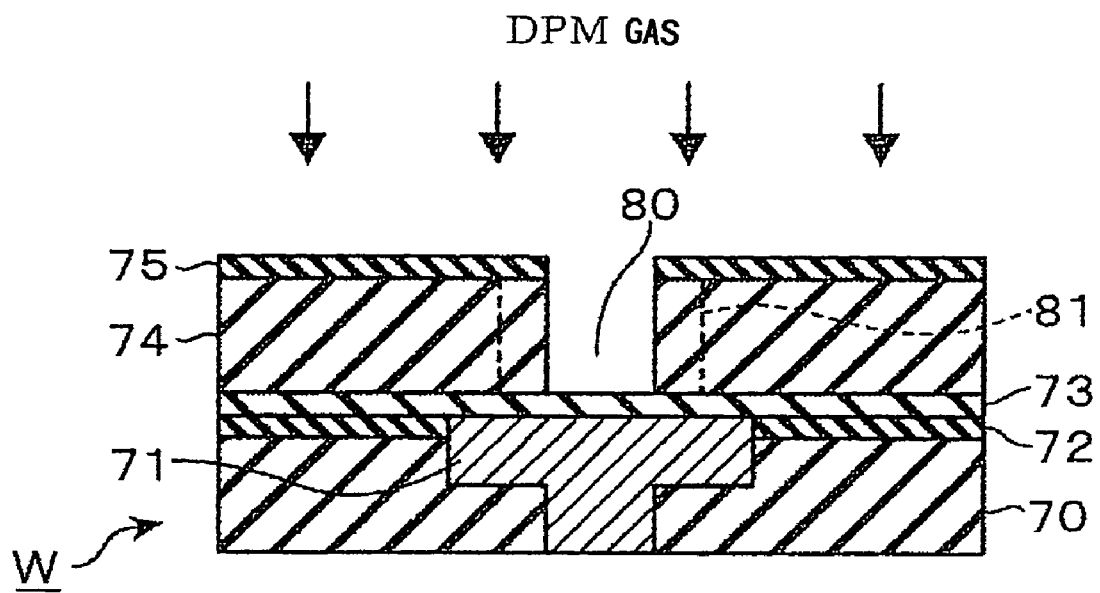
FIGS. 4A and 4B are cross-sectional views for explaining states of a substrate surface after a recovering step in one embodiment of the method for manufacturing a semiconductor device according to the present invention.
Figure 4B:
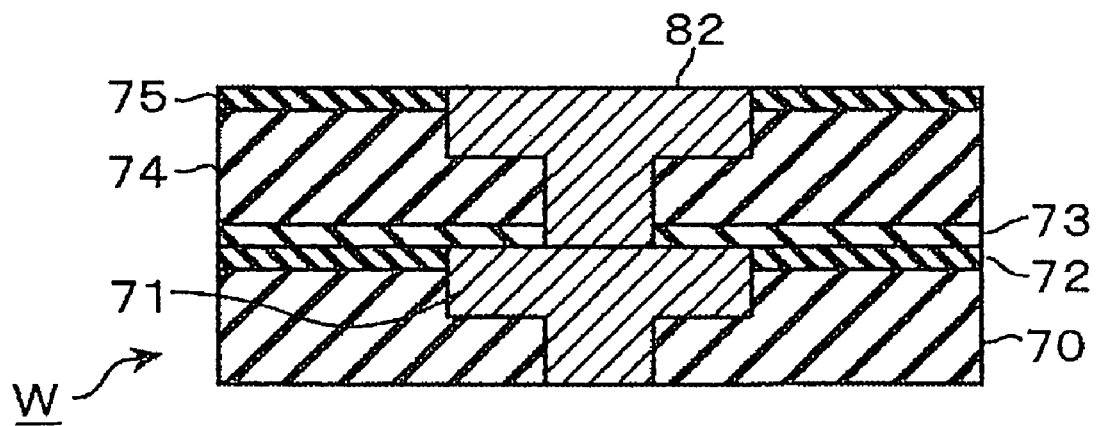

The DPM gas diffuses in the process vessel 21 and reaches the hole 80 and further the surface of the damage layer 81. The DPM gas diffuses deeply in the damage layer 81, while the DPM gas is drawn by a silicon containing the aforementioned dangling bond and a silicon to which a hydroxyl group is connected. Then, the DPM gas, or another organic substance that is a reactive group that has been desorbed from the DPM gas, is connected to the dangling bond of the silicon. In addition, the hydroxyl group which has been connected to the silicon reacts with hydrogen in the DPM gas, whereby the hydroxyl group is desorbed as moisture. In addition, an organic substance is connected to a bond of the silicon from which the hydroxyl group has been desorbed. As a result, as shown in FIG. 4A, the damage layer 81 is recovered.

At this time, as described above, the deposit has adhered to the inner wall of the process vessel 21. However, no special by-product is generated when the DPM gas comes into contact with the deposit, because the DPM gas consists of C, H, and O. Further, even when the SiCOH film 74 includes moisture in the above ashing step, the recovering process can be suitably performed due to a dehydrating effect of the DPM gas.

In addition, as described above, the dense layer has been formed by the energy of the oxygen ions on the surface part of the damage layer 81. However, the DPM gas tends to release protons ($H^+$). Thus, the protons ($H^+$) released therefrom are connected to OH groups in the damage layer 81 to generate $H_2O$, and go out from the damage layer 81. Therefore, even the inside of the damage layer 81 can be suitably recovered.

Thereafter, the process vessel 21 is evacuated, and the wafer W is taken out from the process vessel 21. Then, the wafer W is taken out from the plasma processing apparatus by the transfer arm 66 of the substrate processing apparatus, and is returned to the carrier through a route reverse to the loading route. Subsequently, a new resist pattern is formed, and a groove (trench), by which a wiring can be embedded in the SiCOH film 74, is formed by using this resist pattern. After Cu has been embedded in a recess formed of the groove and the hole 80, a CMP process is performed. Then, as shown in FIG. 6B, an $(n+1)^{th}$ wiring 82 is formed.

According to the above-described embodiment, after the ashing process is performed to the SiCOH film 74 by the plasma, the recovering process is performed to the damage layer 81, which has been formed on the SiCOH film 74 by the plasma, by supplying the DPM gas consisting only of C, H, and O. Thus, irrespective of the presence of the deposit adhering to the inner wall of the process vessel 21 and the presence of the moisture generated in the ashing step, no special by-product is generated when the DPM gas comes into contact with the deposit and/or the moisture. Accordingly, the recovering process can be performed in the same process vessel 21 in which the ashing process was performed. Namely, there is no necessity for additionally disposing a chamber for the recovering process. FIG. 2 shows the six plasma processing apparatus for convenience. However, when a chamber for the recovering process is separately provided from a chamber of the plasma processing apparatus for performing the etching process and the ashing process, as in the conventional manner, twelve chambers (twice the number of the chambers shown in FIG. 2) are necessary to achieve substantially the same throughput as the substrate processing apparatus shown in FIG. 2. Namely, according to the present invention, it can be understood that a surface area of the apparatus can be remarkably reduced as compared with that of a conventional apparatus.

As described above, the DPM gas tends to release protons ($H^+$). Then, the protons ($H^+$) released therefrom are connected to OH groups in the damage layer 81 to generate $H_2O$, and go out from the damage layer 81. Therefore, as compared with a conventional case in which the conventional silazane-containing gas is used, the electric properties can be suitably recovered.

In the above example, after the DPM gas has been supplied into the process vessel 21, the process vessel 21 is closed to provide a closed space. However, it is possible to perform the recovering process while supplying the DPM gas with the not-shown main valve of the exhaust pipe 24 being opened.

In the above example, the wafer W is heated by the heater 36 during the recovering process. However, the branch pipe 42A serving as a flow path of the DPM gas may be equipped with a heating unit so as to heat the DPM gas itself.

In the above example, the etching process and the ashing process are performed in the same process vessel 21. However, the etching process and the ashing process may be performed in separate chambers. Such an example is described below.

Second Embodiment

Figure 5:
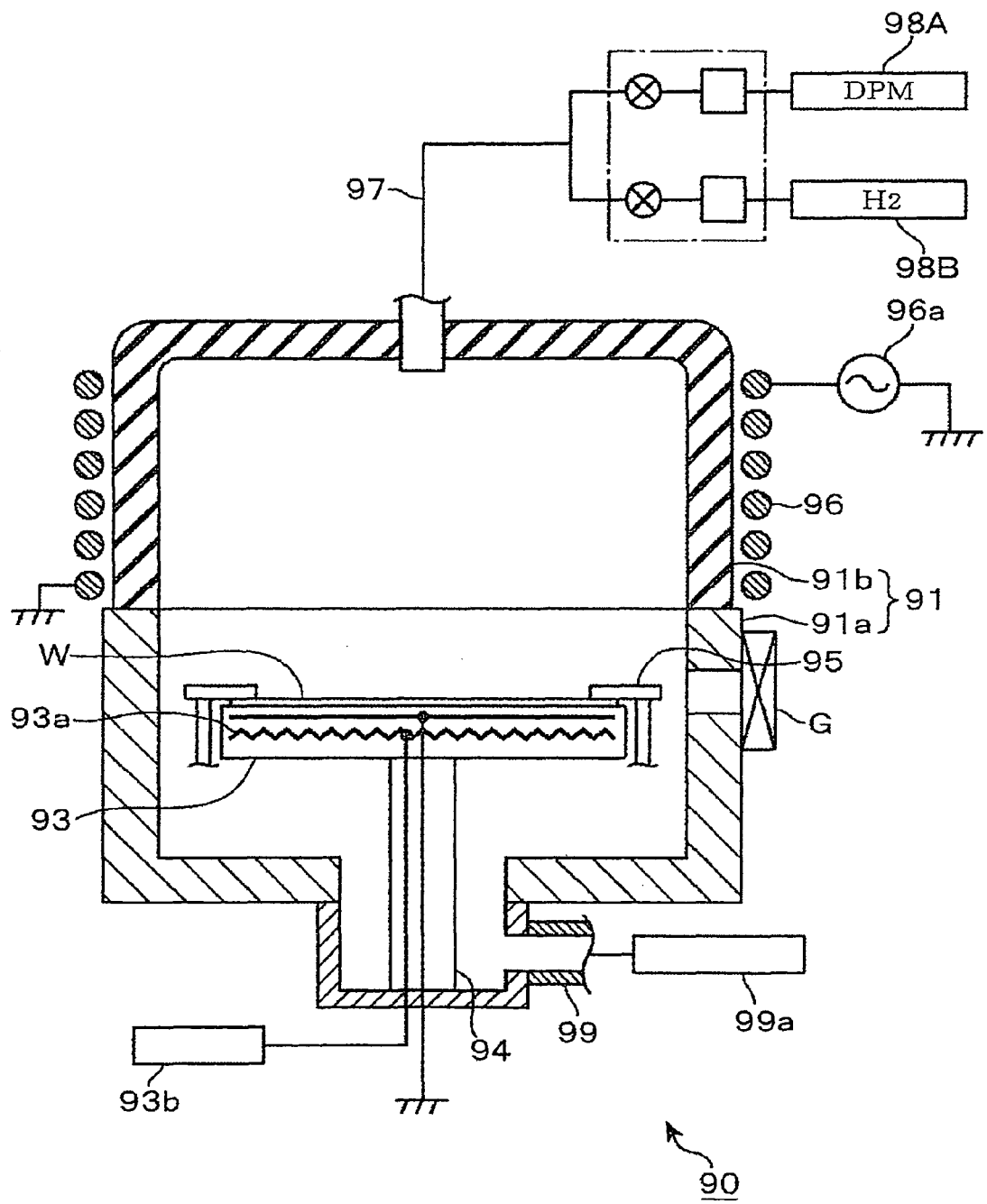
FIG. 5 is a longitudinal sectional view showing an example of an ashing apparatus used for performing a recovering step in one embodiment of the method for manufacturing a semiconductor device according to the present invention.

An ashing apparatus shown in FIG. 5 is an apparatus for performing an ashing process by using an inductively coupled plasma (ICP). Disposed above a lower vessel 91a is a bell jar 91b having a peripheral edge continuously formed with a peripheral edge of the lower vessel 91a. The lower vessel 91a and the bell jar 91b constitute a second process vessel 91. In the process vessel 91, a susceptor 93, which serves as a stage on which a wafer W is placed, is supported by a support member 94. The susceptor 93 is grounded. The reference number 93a depicts a heater as a heating unit, and the reference number 93b depicts a power source. Thus, a wafer W can be heated to a temperature between 150° C. and 400° C., for example. The reference number 95 depicts a clamp ring for clamping a wafer W.

A coil 96, which is an antenna member connected to a radiofrequency power source 96a serving as a means for activating an ashing gas, is wound around the bell jar 91. By supplying a radiofrequency of 300 kHz to 600 MHz to the coil 96, an induction field is formed in the bell jar 91b so that active species can be generated. Connected to a top part of the bell jar 91b are a DPM gas source 98A and a hydrogen gas source 98B, via a gas supply path 97 which functions both as a unit for supplying an ashing gas and as a unit for supplying a dipivaloylmethane gas. Thus, a DPM gas and a hydrogen gas as an ashing gas can be supplied into the bell jar 91b. A vacuum exhaust unit 99a is connected to a lower sidewall of the process vessel 91 through an exhaust path 99. The reference character G depicts a gate valve.

Figure 6:
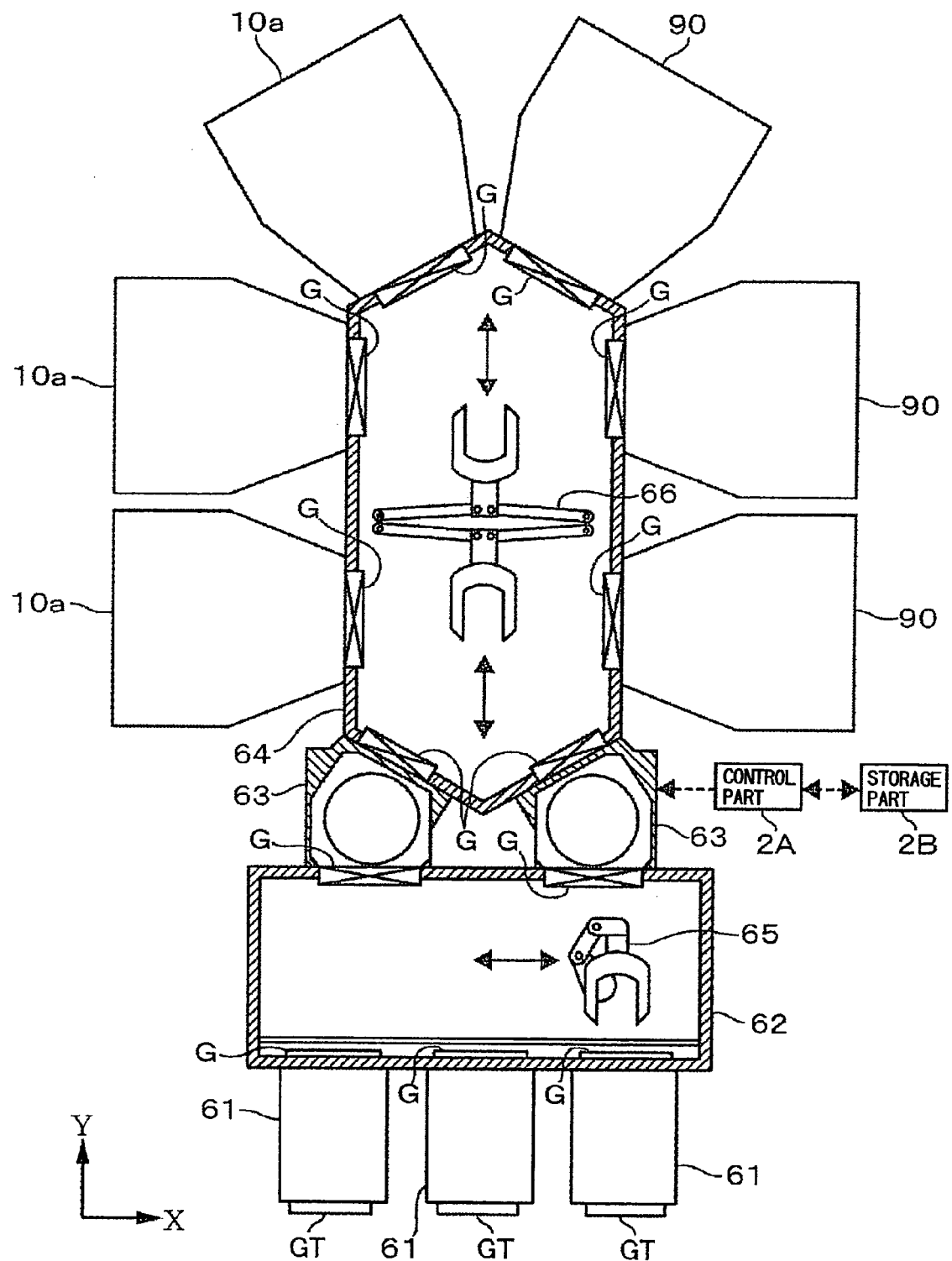
FIG. 6 is a plan view showing an example of a substrate processing apparatus to which the ashing apparatus shown in FIG. 5 is connected.

FIG. 6 is a substrate processing apparatus of a multi-chamber system including the ashing apparatus (indicated by the reference number "90") shown in FIG. 5. The plurality of, e.g., three ashing apparatuses 90 are hermetically connected to a second transfer chamber 94 of a vacuum atmosphere. In addition to the three ashing apparatuses 90, a plurality of, e.g., three etching apparatuses 10a are connected to the second transfer chamber 64. The etching apparatus 10a is an apparatus for performing the etching process as has been described in the first embodiment, and has the same structure as that of the aforementioned plasma processing apparatus 10. Thus, a detailed explanation thereof is omitted. In this substrate processing apparatus, the same reference numbers are given to the same members as those of the aforementioned substrate processing apparatus shown in FIG. 2, excluding the above reference numbers.

In the substrate processing apparatus, after a wafer W has been subjected to the etching process by the etching apparatus 10a, the wafer W is transferred by a transfer arm 66 from the etching apparatus 10a to the ashing apparatus 90 under a vacuum atmosphere.

In the ashing apparatus 90, the wafer W placed on the susceptor 93 is heated to 150° C. to 400° C., for example. Then, a hydrogen gas is supplied from above the wafer W, and a radiofrequency of a predetermined frequency is supplied to the coil 96, so that an induction field is formed in the bell jar 91b. Thus, the hydrogen gas is made into plasma, and hydrogen radicals which are active species are generated. When the plasma (active species) is supplied to the wafer W, the ashing process is performed in the same manner as the above first embodiment. In the ashing apparatus 90, the hydrogen gas is made into plasma by an induction field as described above, in order to reduce a damage suffered by the SiCOH film 74. For this reason, the aforementioned damage layer 81 is formed as a very thin layer.

As a result of the ashing process, a by-product, which has been generated by a reaction between the plasma and the SiCOH film 74 or by a reaction between the plasma and the resist, adhere as a deposit to some part of an inner wall of the process vessel 91 to which the plasma has come into contact.

Thereafter, the supply of the hydrogen gas and the radiofrequency is stopped, and the process vessel 91 is evacuated. Then, similarly to the above first embodiment, a DPM gas is supplied to the wafer W, while the temperature of the wafer W is being maintained at the process temperature at which the wafer W has been ashed. Thus, the DPM gas diffuses in an inside of the damage layer 81, and the same recovering process as that of the first embodiment is performed. Even with the high temperature, no reaction occur between the DPM gas and the deposit on the inner wall of the process vessel 91 and/or the moisture in the SiCOH film 74, and thus the generation of a by-product can be restrained. In addition, since an explosion point of the DPM gas is considered to be 300° C. or more, there is no possibility that an explosion occurs.

Also in the above embodiment, the same effect as that of the first embodiment can be obtained. Under a temperature as high as 400° C., no by-product is generated, which might be generated by a reaction between the DPM gas and the deposit and/or the moisture, and thus the recovering process can be suitably performed. In addition, after the performance of the ashing process, the recovering process can be performed by supplying a DPM gas without heating the wafer W, i.e., at the process temperature which is unchanged from the ashing process temperature. Thus, a time required for increasing and decreasing the temperature of the wafer W can be saved, to thereby improve a throughput.

In addition, as described above, when the ashing process is performed by using the ashing apparatus 90, the size (thickness) of the damage layer 81 is reduced. With respect to such a slight (thin) damage layer 81 as well, the electric properties of the SiCOH film 74 can be suitably recovered by the above recovering process.

Also in this embodiment, as has been described in the first embodiment, it is possible to supply, to the wafer W, a DPM gas which has been heated such that the DPM gas has a predetermined process temperature on the wafer W. In addition, when the process temperature during the ashing process is excessively high, it is possible to dispose a cooling unit in the susceptor 93. In this case, the susceptor 93 can be cooled by the cooling unit such that, after the ashing process, the susceptor 93 has another process temperature suitable for the recovering process. Even in this case, if the process temperature for the ashing process and the process temperature for the recovering process are close to each other, only a short time is required for increasing and decreasing the temperature.

In a case where there is used the ashing apparatus 90 separate from the plasma processing apparatus, as in the above example, the aforementioned process vessel 21 and the radiofrequency power source 40a shown in FIG. 1 respectively correspond to a first process vessel and a first plasma generating unit recited in the claims.

As an ashing apparatus which is used when the etching process and the ashing process are performed by separate apparatuses, there may be employed the following apparatus, for example, in addition to the apparatus that makes an ashing gas into plasma to generate active species.

Third Embodiment

FIG. 7 shows an ashing apparatus, which is called "CAT-ashing apparatus", for performing an ashing process with the use of a catalyst. The ashing apparatus includes a process vessel 101, a stage 102, and a gas showerhead 103. The stage 102 is provided with a heater 102b as a heating unit connected to a power source 102a. Thus, a wafer W placed on the stage 102 can be heated to, e.g., 300° C. In a lower surface side of the gas showerhead 103, there are formed a number of gas jetting holes. To an upper surface side of the gas showerhead 103, there are connected a DPM gas source 105A and a hydrogen gas source 105B through a gas supply path 104 which functions both as a unit for supplying an ashing gas (hydrogen gas) and a unit for supplying a dipivaloylmethane gas (DPM gas). The reference numbers 106 and 106a respectively depict an exhaust path and a vacuum pump.

Disposed between the gas showerhead 103 and the stage 102 is a catalyst wire 107 made of tungsten, which serves as a radical generating unit for activating an ashing gas. The reference number 107a depicts a power source capable of heating the catalyst wire 107 to 1400° C. to 2000° C., for example. Thus, a hydrogen gas can be made into radical so as to generate active species. The reference character G depicts a gate valve.

Similarly to the above-described ashing apparatus shown in FIG. 5, this ashing apparatus is hermetically connected to the second transfer chamber 64 of the substrate processing apparatus (illustration is omitted).

In this ashing apparatus, similarly to the above second embodiment, the following ashing process and the recovering process are performed to a wafer W which has been loaded into the process vessel 101 after the wafer W has been subjected to the etching process by the etching apparatus 10a.

At first, the wafer W is placed on the stage 102, and is heated to 250° C., for example. At the same time, an inside of the process vessel 101 is set at a predetermined vacuum degree. Then, the catalyst wire 107 is electrified so as to be heated to 1400° C. to 2000° C. Then, a hydrogen gas is supplied into the process vessel 101 at a predetermined flow rate from the gas showerhead 103. The hydrogen gas is made into radical by the heat of the catalyst wire 107, whereby hydrogen radicals as active species are generated. When the hydrogen radicals are supplied to the wafer W, the ashing process is performed in the same manner as that of the above examples.

Thereafter, the supply of the hydrogen gas is stopped and the supply of the electricity to the catalyst wire 107 is stopped. Then, the process vessel 101 is evacuated. This state is maintained until the temperature of the catalyst wire 107 is lowered to a predetermined temperature at which a DPM gas is not decomposed. Thereafter, similarly to the above second embodiment, a DPM gas is supplied into the process vessel 101 and the same recovering process as that of the second embodiment is performed. Also in this example, similarly to the above respective examples, the electric properties of the SiCOH film 74 can be suitably recovered.

Also in this example, it is possible to dispose a heating unit on the gas supply path 104 and the like, so as to supply a DPM gas, which has been heated beforehand, to a wafer W. In addition, it is possible to dispose a cooling unit in the stage 102 so as to cool a wafer W after the ashing process.

[Experiments]

Next, experiments conducted for confirming the effect of the present invention are described below. For the following experiment (1), there was used the aforementioned wafer W shown in FIG. 3A. For the other experiments, there was used a wafer W as a dummy wafer in which an SICOH film was deposited on a silicon.

With the use of the plasma processing apparatus 10, the etching process and the ashing process were performed to the above wafers W, and thereafter the recovering process was performed thereto. Regarding the recovering process, as shown in the below Table 1, the experiments were conducted by changing the process temperature. In addition, the following tests were conducted on the wafers W which had been subjected to the etching process and the ashing process, and on the wafers W which had been subjected to the recovering process thereafter.

ture content was obtained by integrating the amount of moisture desorbed from the wafer W when a temperature of the wafer W was increased to 100° C. to 500° C., in accordance with a TDS (thermal desorption spectroscopy).
(Experiment Result)

The experiment result is shown in Table 1. Further, there is shown, as a comparative example, a result of wafers W which were not subjected to the recovering process after they had been subjected to the etching process and the ashing process. Furthermore, there is shown, as a reference example, a result of wafers W (unprocessed) which were not yet subjected to the etching process. The temperatures written in the column of the recovering process are the process temperature during the recovering process.

TABLE 1

| | | Quantity dissolved into hydrofluoric acid (increase in width of hole 80) (nm) | Relative dielectric constant | Leak current (A/cm$^2$) | Contact angle (°) | Moisture Content |
|---|---|---|---|---|---|---|
| with Recovering process | 150° C. | 4 | 2.65 | 2.68E−09 | 75.33 | 2.47E−10 |
| | 200° C. | 4 | 2.78 | 2.47E−09 | 61.10 | 2.95E−10 |
| | 250° C. | 4 | 2.74 | 2.07E−09 | 64.17 | 3.23E−10 |
| Comparative example | | 21 | 3.26 | 7.13E−09 | 6.67 | 4.09E−10 |
| Reference example | | — | 2.38 | 4.90E−09 | — | — |

Since details of the respective experiment conditions, such as an etching condition and an ashing condition, have been described above, and the respective experiments were conducted under the same conditions, explanation of the details thereof is omitted.
(Experiment Content)
(1) Hydrofluoric Immersion Test The damage layer 81 is easily dissolved in the hydrofluoric acid, while the SiCOH film 74 with less damaged is resistant to be dissolved in the hydrofluoric acid. Taking advantage of these phenomena, a quantity of the damage layer 81 was evaluated by measuring a quantity dissolved into the hydrofluoric acid (an increase in width of the hole 80) by means of an SEM.
(2) Relative Dielectric Constant The formation of the damage layer 81 raises the relative dielectric constant. Thus, in order to confirm a quantity of the damage layer 81, the relative dielectric constants were evaluated. A mercury probe was used for the measurement.
(3) Leak Current As described above, the damage layer 81 is likely to absorb moisture, and an insulation property of a wafer W is deteriorated by the moisture. In order to evaluate this property, the leak currents were measured.
(4) Contact Angle of Water When the damage layer 81 is formed, an organic substance is desorbed from the SiCOH film, resulting in moisture absorption. Thus, in accordance with the formation of the damage layer 81, a surface of the SiCOH film changes from a hydrophobic state (as the contact angle of water comes nearer to 90°, the surface is more hydrophobic) into a hydrophilic state. In order to evaluate this property, contact angles of water on the surface of the SiCOH film were measured.
(5) Moisture Content In order to confirm the amount of moisture absorbed by the damage layer 81, moisture contents were measured. A mois- From the above result, it was understood that the properties in all the experiment items could be improved by performing the recovering process (it could be judged that damage layer 81 is made smaller). In addition, as has been described above, with respect to any of the process temperatures, no by-product was generated which might be generated by a reaction between the DPM gas and the deposit on the inner wall of the process vessel 21 and/or the moisture.

The invention claimed is:

1. A method for manufacturing a semiconductor device in a process vessel by using a substrate having a low dielectric constant film with a resist pattern formed in an upper layer of the low dielectric constant film, the method comprising:
    placing the substrate on a stage in the process vessel;
    supplying an etching gas into the process vessel, and making the etching gas into plasma so as to etch the low dielectric constant film by the plasma;
    supplying an ashing gas into the process vessel, and making the ashing gas into plasma so as to ash the resist pattern by the plasma, the plasma made by the etching gas and the plasma made by the ashing gas causing formation of a damage layer on the low dielectric constant film; and
    while the substrate is in a heated condition, supplying a dipivaloylmethane gas into the process vessel, and bringing the dipivaloylmethane gas into contact with a surface of the damage layer to cause the dipivaloylmethane gas to release protons which connect to OH groups in the damage layer to generate $H_2O$, and go out of the damage layer so as to conduct a recover process for recovering the damage layer at its surface and inside thereof.

2. A method for manufacturing a semiconductor device by using a substrate having a low dielectric constant film with a resist pattern formed in an upper layer of the low dielectric constant film, the method comprising:

Placing the substrate on a stage in a first process vessel;

supplying an etching gas into the first process vessel, and making the etching gas into plasma so as to etch the low dielectric constant film by the plasma;

transferring the substrate from the first process vessel to a second process vessel;

supplying an ashing gas into the second process vessel, and activating the ashing gas so as to ash the resist pattern by active species, the etching and the ashing causing formation of a damage layer on the low dielectric constant film; and while the substrate is in a heated condition, supplying a dipivaloylmethane gas into the second process vessel, and bringing the dipivaloylmethane gas into contact with a surface of the damage layer to cause the dipivaloylmethane gas to release protons which connect to OH groups in the damage layer to generate $H_2O$, and go out of the damage layer so as to conduct a recover process for recovering the damage layer at its surface and inside thereof.

3. The method for manufacturing a semiconductor device according to claim 1, wherein
the etching and the ashing are conducted under a condition wherein the temperature of the substrate is within a range of 0° C. to 60° C.

4. The method for manufacturing a semiconductor device according to claim 2, wherein
the etching and the ashing are conducted under a condition wherein the temperature of the substrate is within a range of 0° to 60° C.

5. The method for manufacturing a semiconductor device according to claim 1, wherein
the recovering is performed at a temperature higher than those at which the etching step and the ashing step are performed.

6. The method for manufacturing a semiconductor device according to claim 2, wherein
the recovering is performed at a temperature higher than those at which the etching step and the ashing step are performed.

7. The method for manufacturing a semiconductor device according to claim 1, wherein
the dipivaloylmethane gas is supplied into the processing vessel after being heated.

8. The method for manufacturing a semiconductor device according to claim 2, wherein
the dipivaloylmethane gas is supplied into the processing vessel after being heated.

9. The method for manufacturing a semiconductor device according to claim 1, wherein
the recovering is performed under a condition that the dipivaloylmethane gas is sealed in the processing vessel.

10. The method for manufacturing a semiconductor device according to claim 2, wherein
the recovering is performed under a condition that the dipivaloylmethane gas is sealed in the processing vessel.

11. The method for manufacturing a semiconductor device according to claim 2, wherein
the recovering is performed under a condition that the temperature of the substrate is maintained at a temperature between 50° C. to 150° C.

12. The method for manufacturing a semiconductor device according to claim 2, wherein
the recovering is performed under a condition that the temperature of the substrate is maintained at a temperature between 50° C. to 150° C.

13. A method for recovering a damage layer which has been damaged on a low dielectric constant film after etching and/or ashing the low dielectric constant film with a resist pattern being formed in an upper layer of the low dielectric constant film in a processing vessel, the method comprising:
a recovering step, in which, in order to recover the damage layer, a gas consisting of only C, H and O is supplied into the process vessel so that the gas and the damage layer are brought into contact with each other, wherein
the recovering step is performed under a condition that the gas consisting of only C, H and O is sealed in the processing vessel, and
protons released from the gas consisting of only C, H and O are connected to OH groups in the damage layer to generate $H_2O$, and go out from the damage layer, so that a surface and the inside of the damage layer is recovered.

14. The method for manufacturing a semiconductor device according to claim 13, wherein
the gas consisting of only C, H and O is dipivaloylmethane gas.

15. The method for manufacturing a semiconductor device according to claim 13, wherein
the recovering step is performed under a condition that the temperature of the substrate is maintained at a temperature between 50° C. to 150° C.

* * * * *